US009090989B2

(12) United States Patent
Zwieback et al.

(10) Patent No.: US 9,090,989 B2
(45) Date of Patent: Jul. 28, 2015

(54) VANADIUM COMPENSATED, SI SIC SINGLE CRYSTALS OF NU AND PI TYPE AND THE CRYSTAL GROWTH PROCESS THEREOF

(71) Applicant: II-VI Incorporated, Saxonburg, PA (US)

(72) Inventors: Ilya Zwieback, Township of Washington, NJ (US); Ping Wu, Warren, NJ (US); Varatharajan Rengarajan, Flanders, NJ (US); Avinash K. Gupta, Basking Ridge, NJ (US); Thomas E. Anderson, Morristown, NJ (US); Gary E. Ruland, Morris Plains, NJ (US); Andrew E. Souzis, Hawthorne, NJ (US); Xueping Xu, Westport, CT (US)

(73) Assignee: II-VI Incorporated, Saxonburg, PA (US)

(*) Notice: Subject to any disclaimer, the term of this patent is extended or adjusted under 35 U.S.C. 154(b) by 232 days.

(21) Appl. No.: 13/902,016

(22) Filed: May 24, 2013

(65) Prior Publication Data

US 2013/0320275 A1    Dec. 5, 2013

Related U.S. Application Data

(60) Provisional application No. 61/651,143, filed on May 24, 2012.

(51) Int. Cl.
*H01B 1/02* (2006.01)
*H01B 1/22* (2006.01)
(Continued)

(52) U.S. Cl.
CPC ............... *C30B 23/002* (2013.01); *C30B 29/36* (2013.01); *H01B 3/025* (2013.01)

(58) Field of Classification Search
CPC ........ C30B 23/00; C30B 23/02; C30B 29/36; H01B 3/025
USPC ................... 252/512; 117/105, 109; 423/346
See application file for complete search history.

(56) References Cited

U.S. PATENT DOCUMENTS 5,611,955 A    3/1997 Barrett et al.
5,856,231 A    1/1999 Niemann et al.
(Continued)

OTHER PUBLICATIONS

Bickermann et al., "Preparation of Semi-Insulating Silicon Carbide by Vanadium Doping During PVT Bulk Crystal Growth", Materials Science Forum, 2003, pp. 51-54, vols. 433-436.

(Continued)

*Primary Examiner* — Khanh Tuan Nguyen
(74) *Attorney, Agent, or Firm* — The Webb Law Firm

(57) ABSTRACT

In a crystal growth apparatus and method, polycrystalline source material and a seed crystal are introduced into a growth ambient comprised of a growth crucible disposed inside of a furnace chamber. In the presence of a first sublimation growth pressure, a single crystal is sublimation grown on the seed crystal via precipitation of sublimated source material on the seed crystal in the presence of a flow of a first gas that includes a reactive component that reacts with and removes donor and/or acceptor background impurities from the growth ambient during said sublimation growth. Then, in the presence of a second sublimation growth pressure, the single crystal is sublimation grown on the seed crystal via precipitation of sublimated source material on the seed crystal in the presence of a flow of a second gas that includes dopant vapors, but which does not include the reactive component.

21 Claims, 4 Drawing Sheets

(51) Int. Cl.
   *C30B 23/00*   (2006.01)
   *C30B 29/36*   (2006.01)
   *H01B 3/02*    (2006.01)

(56) References Cited

U.S. PATENT DOCUMENTS

| | | |
|---|---|---|
| 6,410,433 B1 | 6/2002 | Hautala et al. |
| 6,507,046 B2 | 1/2003 | Mueller |
| 7,018,597 B2 | 3/2006 | Ellison et al. |
| 7,608,524 B2 | 10/2009 | Gupta et al. |
| 8,216,369 B2 | 7/2012 | Gupta et al. |
| 8,361,227 B2 | 1/2013 | Zwieback et al. |
| 2003/0079676 A1 | 5/2003 | Ellison et al. |
| 2008/0072817 A1* | 3/2008 | Zwieback et al. ............ 117/84 |
| 2008/0190355 A1 | 8/2008 | Chen et al. |
| 2010/0159182 A1 | 6/2010 | Straubinger et al. |
| 2012/0103249 A1 | 5/2012 | Gupta et al. |

OTHER PUBLICATIONS

Nunnally et al., "Silicon Carbide Photo-Conductive Switch Results Using Commercially Available Material", IEEE, 2010, pp. 170-173.
Sheppard et al., "High-Power Microwave GaN/AlGaN HEMT's on Semi-Insulating Silicon Carbide Substrates", IEEE Electron Device Letters, Apr. 1999, pp. 161-163, vol. 20, No. 4.

* cited by examiner

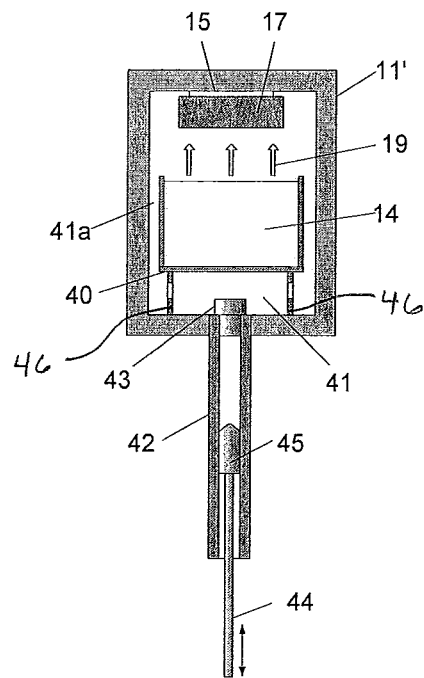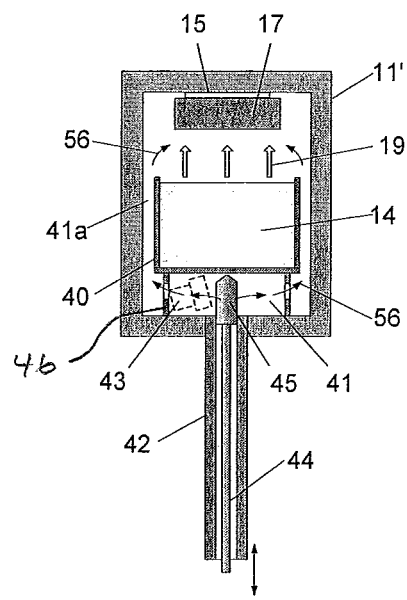
Fig. 5A              Fig. 5B
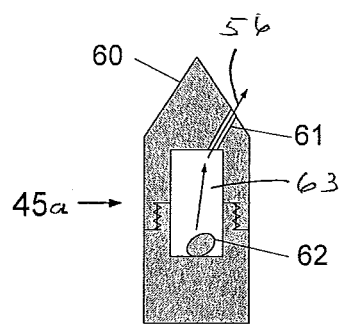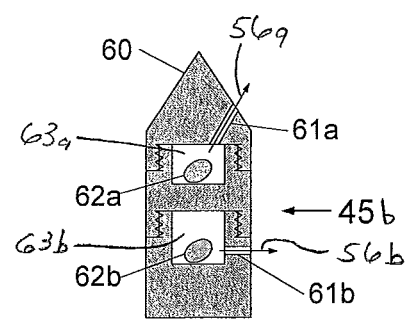
Fig. 6A              Fig. 6B

US 9,090,989 B2

VANADIUM COMPENSATED, SI SIC SINGLE CRYSTALS OF NU AND PI TYPE AND THE CRYSTAL GROWTH PROCESS THEREOF

BACKGROUND OF THE INVENTION

1. Field of the Invention

The present invention relates to silicon carbide single crystals and, in particular, to vanadium-compensated, Semi-Insulating (hereafter 'SI) SiC single crystals of 4H and 6H polytype intended for applications in semiconductor, electronic and optoelectronic devices.

2. Description of Related Art

DEFINITIONS

The following definitions will be used herein.

Donors. Impurities in a semiconductor which are capable of donating electrons to the Conduction Band (hereafter 'CB) or to other levels in the bandgap are called donors.

Acceptors. Impurities in a semiconductor which are capable of capturing electrons from the Valance Band (hereafter 'VB) or from other levels in the bandgap are called acceptors.

Shallow Donors. Donors which are substantially ionized at room temperature are called shallow donors. Nitrogen (N) is an element of the V Group of the Periodic Table having 5 valence electrons. In the SiC lattice, N substitutes for C and gives four electrons to form ionic-covalent bonds with four silicon neighbors, thus assuming a ground state with one extra electron. The binding energy of this extra electron is about 0.08 eV; accordingly, the energy level of N in the SiC bandgap is at about 0.08 eV below the CB. Due to the low binding energy, N easily ionizes by donating one electron to the CB. As an example, in a 6H SiC crystal including N at a concentration between $1 \cdot 10^{16}$ and $1 \cdot 10^{17}$ N atoms-$cm^{-3}$, about 60 to 90% of N donors are ionized at room temperature producing approximately between $9 \cdot 10^{15}$ and $6 \cdot 10^{16}$ $cm^3$ electrons in the CB. A semiconductor having electric conductivity due to free electrons is called n-type.

Shallow Acceptors. Acceptors which are substantially ionized at room temperature are called shallow acceptors. Boron (B) is an element of the III Group of the Periodic Table having 3 valence electrons. In the SiC lattice, B substitutes for Si and gives these three electrons to form bonds with the carbon neighbors. It lacks one electron to finish the tetrahedral covalent configuration and, therefore, is ready to accept one electron on the orbit, i.e., to act as an acceptor. Lacking one electron is equivalent of having one hole on the outer orbit, and accepting one electron from VB is equivalent to generating one free hole in VB. In the ground state, the binding energy of the B-bound hole is between 0.2 and 0.3 eV; accordingly, the energy levels of B in the SiC bandgap are at 0.2-0.3 eV above VB. Note that boron and nitrogen can occupy several sites in the SiC lattice and produce multiple energy levels in the SiC bandgap. As an example, a 6H SiC crystal including B at a concentration between $1 \cdot 10^{16}$ and $1 \cdot 10^{17}$ B atoms-$cm^{-3}$, will have between 3% and 10% of the B acceptors ionized at room temperature, thus producing approximately between $1 \cdot 10^{15}$ and $3 \cdot 10^{15}$ $cm^{-3}$ holes in the VB. A semiconductor having electric conductivity due to free holes is called p-type.

Deep Donors and Acceptors are donors and acceptors having higher binding energies for electrons and holes, respectively, and therefore are not substantially ionized at room temperature. Compared to shallow donors and acceptors, the energy levels of deep donors and acceptors are positioned deeper in the bandgap. Vanadium (V) produces two deep levels in the SiC bandgap—one deep donor at 1.5 eV above VB and one deep acceptor at 0.8 eV below CB. Deep acceptors can capture electrons, while deep donors can capture holes.

Compensated Semiconductor. In a semiconductor containing both donors and acceptors, an electron from the donor can be captured by the acceptor. This phenomenon is known as compensation. The consequence of such compensation will be a reduced density of free charge carriers. Compared to a semiconductor with a dominant donor or a dominant acceptor, the resistivity of a compensated semiconductor is higher.

Fully Compensated Semiconductor. A semiconductor is considered fully compensated when all free charge carriers generated by thermal emission from shallow donors or shallow acceptors are removed and the resistivity approaches a theoretical limit determined by transitions from the deep level to the band edge. The phenomenon of full compensation in application to vanadium doped SiC will be discussed hereinafter in more detail.

Compensation with Shallow Levels. A crystal including shallow acceptors (or donors) can be compensated by the introduction of shallow donors (or acceptors). Full compensation and maximum resistivity are achieved when $N_D=N_A$, where $N_D$ and $N_A$ are concentrations of shallow donors and acceptors, respectively. Such compensation requires precise and equal numbers of donors and acceptors, which is practically impossible to achieve. In SiC, both nitrogen shallow donors and boron shallow acceptors are background impurities and their concentrations are difficult to control.

Compensation with Deep Levels. A more reliable way to achieve compensation is by the introduction of deep levels. For instance, a crystal including shallow donors (or acceptors) can be compensated with a deep acceptor (or donor). This type of compensation does not require precise matching of concentrations. Instead, deep levels must be dominant, that is, present in higher concentrations than the shallow levels.

NU-Type Semiconductor. In the case when a crystal including shallow donors is compensated with a deep acceptor, full compensation and maximum resistivity are achieved when the deep acceptor concentration ($N_{DA}$) exceeds that of shallow donors ($N_D$): $N_{DA}>N_D$. Upon heating of such a fully compensated semiconductor, the electrons captured by the deep acceptor return to CB leading to n-type conductivity with the activation energy equal to the energy level of the deep acceptor counted from the Conduction Band (CB). This type of fully compensated semiconductor is called NU-type, NU standing for Greek letter v.

PI-Type Semiconductor. In the case when a crystal including shallow acceptors is compensated with a deep donor, full compensation and maximum resistivity are achieved when the deep donor concentration ($N_{DD}$) exceeds that of shallow acceptors ($N_A$): $N_{DD}>N_A$. Upon heating of this fully compensated semiconductor, the holes captured by the deep donor return to VB leading to p-type conductivity with the activation energy equal to the energy level of the deep donor counted from the Valence Band (VB). This type of fully compensated semiconductor is called PI-type, PI standing for Greek letter π.

More generally, when a crystal contains shallow donors ($N_D$) and shallow acceptors ($N_A$), its full compensation is achieved when the density of deep levels exceeds the net shallow impurity concentration expressed as $|N_D-N_A|$.

Electronic Properties of SiC Crystals Compensated with Vanadium

Nitrogen (shallow donor) and boron (shallow acceptor) are main background impurities always present in measurable concentrations in sublimation-grown SiC crystals. In 4H and 6H SiC, nitrogen donors have their energy levels at about 0.08 eV below CB, while boron acceptors have their energy levels at 0.2-0.3 eV above VB.

Electronic compensation of SiC with vanadium is well known. Background regarding electronic compensation of SiC with vanadium can be found in U.S. Pat. No. 5,611,955; U.S. Pat. No. 7,018,597; U.S. Pat. No. 6,507,046; U.S. Pat. No. 5,856,231; and Bickermann et al. "Preparation of SI SiC by Vanadium Doping during PVT Bulk Crystal Growth", J. Mat. Sci. Forum (V. 433-436) pp. 51-54. The electron configuration of neutral V atom is $3d^34s^2$. In the SiC lattice, vanadium substitutes for Si atom and loses two s and two d electrons to form ionic-covalent bonds with the four surrounding C neighbors. This leaves the $V^+$ ion with one electron on the 3d-shell. The 3d-shell of vanadium is split by the SiC crystal field into $3d^1$ and $3d^2$ orbitals positioned within the SiC bandgap: the $3d^1$ orbital is located ~1.5 eV above VB, while the $3d^2$ orbital is located ~0.8 eV below CB. In the absence of shallow impurities, the $3d^1$ orbital is filled, while the $3d^2$ orbital is empty.

As a result of this electron configuration, vanadium in SiC can compensate either shallow donors or shallow acceptors, depending on what element dominates in the shallow impurity background. When a shallow donor is dominant, i.e. $N_D > N_A$, vanadium captures electrons from the shallow donor onto its empty $3d^2$ orbital ($V^{4+} + e^- \rightarrow V^{3+}$), thus acting as a deep acceptor. In the case of full compensation, the Fermi level coincides with the level of the vanadium deep acceptor at about 0.8 eV below CB. Upon heating, free electrons are released back into the CB with the activation energy of ~0.8 eV. This type of fully compensated SiC is a semiconductor of NU-type. The theoretical limits for the resistivity of NU-type 6H SiC and 4H SiC are in the range between $2 \cdot 10^{11}$ and $4 \cdot 10^{11}$ Ohm-cm at room temperature.

When a shallow acceptor is dominant, i.e. $N_A > N_D$, vanadium captures holes from the shallow acceptor onto its 3d' orbital VB ($V^{4+} + h^+ \rightarrow V^{5+}$), thus acting as a deep donor. In the case of full compensation, the Fermi level coincides with the level of the vanadium deep donor at ~1.5 eV above VB. Upon heating, holes are released back into the VB with the activation energy of ~1.5 eV. This type of fully compensated SiC is a semiconductor of PI-type. The theoretical limits for the resistivity of PI-type 6H SiC and 4H SiC are as high as $10^{20}$-$10^{21}$ Ohm-cm at room temperature.

In the rare case when an SiC crystal is compensated with vanadium, while shallow acceptors approximately balance shallow donors, the Fermi level position and electronic properties of the crystal are determined by the vacancy-related native point defects, said defects having their energy levels in the middle portion of the gap and present in sublimation-grown SiC crystals at concentrations on the order of $10^{15}$-$10^{16}$ cm$^{-3}$. In such crystals, the Fermi level is often found at 0.9 to 1.5 eV from the conduction band (CB). Upon heating, the compensated crystal can assume either n- or p-type conductivity, depending on the nature of the deep-level point defects, with the activation energies ranging from 0.9 to 1.5 eV. Due to the Fermi level position near the mid-gap, the resistivity of such crystals is higher than in the NU-type crystals, such as $10^{12}$ Ohm-cm or higher. Conditionally, one can designate such crystals as PI-type as well.

Normally, vanadium substitutes for silicon in the SiC lattice. However, vanadium and other impurities can also occupy "abnormal" sites in the lattice. For instance, vanadium can substitute for carbon, or can occupy defect-relates sites, such as dislocations and sub-grain boundaries, or form clusters with vacancies. An impurity occupying an "abnormal" site in the crystal lattice can show an electrically "abnormal" behavior or be electrically inactive.

The technique of Secondary Ion Mass Spectroscopy (SIMS) is commonly used to determine the concentrations of impurities in SiC. This technique yields the total impurity concentration, both in electrically active and electrically inactive states. Therefore, the impurity concentration determined by SIMS is always higher than the electrically active impurity concentration.

When the vanadium concentration ($N_V$) is equal or slightly higher than $|N_D - N_A|$, wherein $N_V$, $N_D$ and $N_A$ are determined by SIMS, the SiC crystal can still have free charge carriers due to the fact that not all of the impurities are in the electrically active state. Therefore, full compensation can be achieved reliably only when $N_V$ is at least 3-4 times higher than $|N_D - N_A|$.

SiC Sublimation Growth—Prior Art

The conventional technique of sublimation, often called Physical Vapor Transport (PVT), has been widely used for the growth of commercial-size SiC single crystals. A schematic view of a prior art PVT growth cell 8 is shown in FIG. 1. The process is carried out in PVT growth cell 8 which includes a chamber 10, which is usually water-cooled and made of fused silica, which includes a growth crucible 11 and thermal insulation 12 which surrounds the crucible inside of chamber 10. Growth crucible 11 is commonly made of dense, fine-grain, isostatically molded graphite, while thermal insulation 12 is made from light-weight, fibrous graphite.

Crucible 11 is sealed with graphite lid 11a and includes SiC sublimation source 14 and SiC seed crystal 15. Generally, SiC source 14 is polycrystalline SiC grain disposed at the bottom of crucible 11. SiC seed 15 is a SiC wafer disposed at the crucible top. Other graphite components of the growth cell (not shown) can include heat shields, growth guides, spacers, etc. Inductive and/or resistive type of heating can be used in SiC crystal growth; as a non-limiting illustration, FIG. 1 shows RF coil 16 as a heater.

Typical SiC sublimation growth temperatures are between 2000° C. and 2400° C. At these temperatures, SiC source 14 vaporizes and fills the crucible with SiC vapors 19 that includes $Si_2C$, $SiC_2$ and Si volatile molecules. During growth, a temperature of SiC source 14 is maintained higher by 10° C.-200° C. than that of SiC seed 15; this forces SiC vapors 19 to migrate and precipitate on SiC seed 15 causing growth of a SiC single crystal 17 on SiC seed 15. Vapor transport is symbolized in FIG. 1 by arrows 19. In order to control the growth rate of SiC single crystal 17 and ensure high crystal quality, SiC sublimation growth is carried out under a small pressure of inert gas, generally, between several and 100 Torr.

All SiC crystals grown by sublimation in accordance with the prior art include substantial concentrations of nitrogen (N) and boron (B) as unintentional background impurities. Graphite is the main source of background nitrogen in SiC crystals. When exposed to air, the graphite forming PVT growth cell 8 readily adsorbs $H_2O$, $O_2$ and $N_2$ from the atmosphere. Upon heating, graphite releases these gases into the interior of growth crucible 11. At high temperatures of SiC sublimation growth, oxygen and water vapor react with carbon to form CO, $CO_2$, and $H_2$, while nitrogen causes contamination of SiC single crystal 17.

The graphite forming PVT growth cell 8 is also the main source of background boron. Inside a graphite lattice, boron forms strong chemical bonds with the neighboring carbon atoms (hereafter 'carbon-bound boron'). When the Si-bearing vapors 19 attack and erode the wall of the graphite growth crucible, they react with boron and transport it to the growing SiC crystal.

SiC sublimation growth in accordance with the prior art employs conventional measures aimed at the reduction of boron and nitrogen contamination. It is common practice in SiC growth to use halogen-purified graphite for parts. However, commercially-available purified graphite can still contain boron at levels of 0.1-0.2 weight ppm. This translates to the presence of background B in the crystals at levels on the order of $10^{16}$ cm$^3$. Graphite with lower boron levels is not routinely available from commercial manufacturers.

In order to reduce the presence of nitrogen, pre-growth vacuum outgassing of PVT growth cell 8 and growing of SiC Crystal 17 under a continuous flow of a high-purity inert gas are commonly employed during SiC growth. However, these common measures are only partially effective and contamination of growing SiC crystals 17 with nitrogen remains a problem.

As a result of insufficient removal of $N_2$ from the growth ambient, concentrations of background nitrogen in SiC crystals 17 grown in accordance with the prior art can be as high as $1 \cdot 10^{17}$ cm$^{-3}$, especially, in the first-to-grow portions of the crystal.

SUMMARY OF THE INVENTION

Disclosed herein is a SiC sublimation crystal growth process designed to yield high-quality, vanadium-compensated, SI SiC single crystals of NU-type and PI-type. The term NU-type refers to a specific type of fully compensated semiconductor, in which the shallow impurity background is dominated by donors. The term PI-type refers to a specific type of fully compensated semiconductor, in which the shallow impurity background is dominated by acceptors.

Also disclosed herein is a SiC crystal growth apparatus for the growth of high-quality, vanadium-compensated, SI 4H—SiC and SI 6H—SiC single crystals of NU-type and PI-type.

Also disclosed herein are high-quality, vanadium-compensated, SI 4H—SiC and SI 6H—SiC single crystals of PI-type.

Also disclosed herein are high-quality, vanadium-compensated, SI 4H—SiC and SI 6H—SiC single crystals of NU-type.

The high-quality, vanadium-compensated, SI SiC single crystals disclosed herein can be used in ultra-fast Photoconductive Semiconductor Switches (PCSS), and as lattice-matched, high thermal conductivity, insulating substrates in epitaxial SiC- and GaN-based semiconductor devices. Background regarding the use of SI SiC single crystals in PCSS can be found in Nunnally et al. "SiC Photo-Conductive Switch Results Using Commercially Available Material", In Power Modulator and High Voltage Conference (IPMHVC), 2010 IEEE International, 23-27 May 2010, pp. 170-173. Background regarding the use of SI SiC substrates for GaN-based devices can be found in Sheppard et al. "High-Power Microwave GaN/AlGaN HEMTs on Semi-Insulating Silicon Carbide Substrates" in Published in Electron Device Letters, IEEE Vol. 20, Issue 4, pp. 161-163.

Requirements of the SI SiC crystal depend on the type of the device. In one example, NU-type SiC is a material of choice for RF devices where a SI SiC substrate with the Fermi level in the upper half of the bandgap is required. In another example, PI-type SiC is a material of choice for devices where a SI SiC substrate having the Fermi level in the middle portion of the bandgap is preferred. In yet another example, PI-type SiC is a material of choice for devices where a SI SiC substrate with extremely high resistivity in excess of $2 \cdot 10^{11}$ Ohm-cm is required. In yet another example, a preferred material for a PCSS switch triggered by a 1064 nm light (Nd:YAG laser) is a compensated with vanadium SI SiC crystal of NU-type.

Disclosed herein is a crystal growth method comprising: (a) providing a SiC single crystal seed and a polycrystalline SiC source material in spaced relation inside of a growth crucible that is disposed inside of a furnace chamber, the growth crucible disposed inside of a furnace chamber defining a growth ambient; and (b) sublimation growing a SiC single crystal on the SiC seed crystal via precipitation of sublimated SiC source material on the SiC seed crystal in the presence of a reactive atmosphere in the growth ambient that removes donor and/or acceptor background impurities from the growth ambient.

The reactive atmosphere can include a halide vapor compound and one or more inert gases. The halide vapor compound can be comprised of (1) fluorine or chlorine, and (2) tantalum or niobium. The one or more inert gases can include argon, hydrogen, or a mixture of argon+hydrogen.

The method can further include: (c), following step (b), changing the atmosphere in the growth ambient to a non-reactive atmosphere; and (d), following step (c), introducing into the growth ambient a vanadium dopant that causes the portion of the SiC single crystal sublimation growing on the SiC seed crystal after step (c) to be fully compensated and semi-insulating.

Step (d) can further include introducing into the growth ambient a dopant of boron or nitrogen.

In step (d), the vanadium dopant is introduced into the growth ambient via controlled effusion.

Introducing the vanadium dopant into the growth ambient in step (d) can include moving the vanadium dopant from a position outside the growth crucible where the vanadium dopant is a solid to a position inside the growth crucible where the vanadium dopant produces vanadium vapors during sublimation growth of the SiC single crystal.

A pressure inside of the growth crucible during sublimation growth of the SiC single crystal can be between 1 and 200 Torr.

Also disclosed is a SiC single crystal sublimation growth apparatus comprising: a growth ambient comprised of a growth crucible inside of a furnace chamber, wherein an interior of the growth crucible is configured to be charged with a SiC single crystal seed and a SiC source material in spaced relation; a doping capsule charged with at least one dopant; means for introducing the doping capsule charged with at the least one dopant from a position outside the growth crucible where the at least one dopant is in solid form to a position inside the growth crucible where the at least one dopant releases dopant vapors into the growth crucible; and a gas distribution system operative for: (1) supplying into the growth ambient during sublimation growth of a SiC single crystal on the SiC single crystal seed via sublimation of the SiC source material prior to introducing the doping capsule into the growth crucible, a first gas which includes a reactive component that chemically binds to and removes donor and/or acceptor background impurities from the growth ambient; and (2) supplying into the growth ambient during sublimation growth of the SiC single crystal on the SiC single crystal seed via sublimation of the SiC source material following introducing the doping capsule into the growth crucible, a second gas comprised of at least one inert gas.

The means for introducing the doping capsule can include a tube in communication with the growth crucible via a plug that seals an end of the tube in communication with the growth crucible, and a pushrod for moving the doping capsule though the tube dislodging the plug, whereupon the doping capsule can be moved into the growth crucible via the end of the tube in communication with the growth crucible.

The doping capsule can include at least one calibrated capillary for the flow of dopant vapors from an interior of the doping capsule into the growth crucible.

The at least one dopant can include at least one of the following: vanadium, or vanadium and boron.

The reactive component of the first gas can be gaseous metal halide. The second gas can comprise either hydrogen or nitrogen, but not a reactive component.

The growth crucible, the doping capsule, or both can be made from graphite.

The SiC source material is disposed in a source crucible which is spaced from a bottom and a side of the interior of the growth crucible.

Also disclosed herein is a crystal growth method comprising: (a) introducing a polycrystalline source material and a seed crystal into a PVT growth ambient comprised of a growth crucible disposed inside of a furnace chamber; (b) in the presence of a first sublimation growth pressure in the growth ambient, sublimation growing a single crystal on the seed crystal via precipitation of sublimated source material on the seed crystal in the presence of a flow of a first gas that includes a reactive component that reacts with and removes donor and/or acceptor background impurities from the growth ambient during said sublimation growth; and (c) following step (b) and in the presence of a second sublimation growth pressure in the growth ambient, sublimation growing the single crystal on the seed crystal via precipitation of sublimated source material on the seed crystal in the presence of a flow of a second gas that includes dopant vapors, but which does not include the reactive component.

Each sublimation growth pressure can be between 1 and 200 Torr. The first and second sublimation growth pressures can be the same or different.

The method can further include introducing a source of the dopant vapors into the growth crucible between steps (b) and (c).

Steps (b) and (c) are desirably performed without exposing the growth ambient to ambient (or room) atmosphere between said steps.

The reactive component of the first gas can be a gaseous metal halide. The dopant vapors of the second gas can comprise gaseous vanadium. The second gas further comprises hydrogen, nitrogen or hydrogen+nitrogen.

Also disclosed is a method of forming a high-purity SiC single crystal comprising: (a) providing SiC growth ambient, which includes a growth crucible and a furnace chamber to hold the growth crucible, said growth crucible charged with a SiC source and a SiC seed crystal in spatial relation; (b) providing a reactive atmosphere in the growth ambient, said atmosphere comprising gaseous species capable of chemical binding of donor and/or acceptor background impurities present in the growth ambient and removing said impurities from said growth ambient by means of chemical binding; (c) in the presence of the reactive atmosphere, heating and sublimating the source material, transporting the sublimated source material to the seed crystal and precipitating the sublimated source material on said seed crystal causing growth of high-purity SiC single crystal; and (d) forming a high-purity SiC single crystal comprising donor and/or acceptor background impurities, wherein their concentrations are intentionally reduced by means of chemical binding of said impurities with the gaseous species of the reactive atmosphere.

The reactive atmosphere can include at least one reactive gaseous component capable of chemical binding of gaseous nitrogen at elevated temperatures and removing it from the growth ambient by forming solid metal nitride. The reactive gaseous component can be gaseous metal halide. The reactive atmosphere can comprise gaseous metal halide and hydrogen.

The reactive atmosphere can comprise at least one reactive gaseous component capable of chemical binding of boron at elevated temperatures, including carbon-bound boron, and removing it from the growth ambient by chemical binding of said boron into boron-bearing volatile molecular associates. The reactive gaseous component can be gaseous metal halide. The first reactive atmosphere can comprise gaseous metal halide and hydrogen.

The reactive atmosphere can include gaseous components capable of reacting between themselves at elevated temperatures to yield gaseous hydrogen halide. The reactive atmosphere can include a gaseous metal halide chosen from the group consisting of $TaCl_5$, $TaF_5$, $NbCl_5$ and $NbF_5$. The reactive atmosphere desirably includes gaseous tantalum pentachloride, $TaCl_5$.

The high-purity SiC single crystal can include nitrogen as a background impurity, wherein the concentration of said background nitrogen is intentionally reduced to concentrations between $4 \cdot 10^{15}$ and $7 \cdot 10^{15}$ atoms-$cm^{-3}$, as measured by SIMS. Also or alternatively, the high-purity SiC single crystal can include boron as a background impurity, wherein the concentration of said background boron is intentionally reduced to concentrations between $2 \cdot 10^{15}$ and $8 \cdot 10^{15}$ atoms-$cm^{-3}$, as measured by SIMS.

The high purity SiC single crystal can have a polytype selected from the group consisting of the 4H and 6H polytypes of silicon carbide.

Also disclosed is an apparatus for sublimation growth of high-purity SiC single crystals comprising: a furnace chamber holding a growth crucible charged with SiC source material and a SiC seed crystal in spaced relation; a gas distribution system to supply a flow of gas mixture into the furnace chamber, said gas mixture forming a reactive atmosphere in the furnace chamber capable of chemical binding at elevated temperatures of donor and/or acceptor background impurities in a SiC growth ambient that includes the furnace chamber and growth crucible, leading to removal of the donor and/or the acceptor background impurities from said growth ambient by means of chemical binding; and the crystal growth crucible containing the SiC source material growing by sublimation on the SiC seed crystal under reactive atmosphere to thereby form a high-purity SiC crystal boule on the SiC seed crystal.

The gas mixture can include at least one reactive gaseous component capable of chemical binding of gaseous nitrogen at elevated temperatures and removing it from the growth ambient by precipitating it in the form of solid nitride. The reactive gaseous component can be gaseous metal halide. The gas mixture can be gaseous metal halide and hydrogen.

The gas mixture can include at least one reactive gaseous component capable of chemical binding of boron, including carbon-bound boron, and removing it from the growth ambient by chemical binding of said boron into boron-bearing volatile molecular associates. The reactive gaseous component can be gaseous metal halide. The gas mixture can include gaseous metal halide and hydrogen.

The gas mixture can comprise reactive gaseous components capable of reacting between themselves at elevated temperatures to yield gaseous hydrogen halide. The gas mixture can comprise gaseous metal halide chosen from the group consisting of TaCl$_5$, TaF$_5$, NbCl$_5$ and NbF$_5$. The gas mixture desirably comprises gaseous tantalum pentachloride, TaCl$_5$.

Also disclosed is a sublimation-grown, high purity SiC single crystal comprising nitrogen as a background impurity, wherein the concentration of said nitrogen is reduced by removal of the residual nitrogen from the growth ambient by means of chemical binding. The concentration of background nitrogen can be reduced to levels between $4 \cdot 10^{15}$ and $7 \cdot 10^{15}$ atoms-cm$^{-3}$, as measured by SIMS. The as-grown crystal can have a polytype selected from the group consisting of the 4H and 6H polytypes of silicon carbide.

Also disclosed is a sublimation-grown, high purity SiC single crystal comprising boron as a background impurity, wherein the concentration of said boron is reduced by removal of the residual boron from the growth ambient by means of chemical binding. The concentration of background boron can be intentionally reduced to concentrations between $20 \cdot 10^{15}$ and $8 \cdot 10^{15}$ atoms-cm$^{-3}$, as measured by SIMS. The as-grown crystal can have a polytype selected from the group consisting of the 4H and 6H polytypes of silicon carbide.

Also disclosed is a method of forming a fully compensated, semi-insulating SiC single crystal of PI-type comprising: (a) providing a SiC growth ambient, which includes a growth crucible and a furnace chamber holding the growth crucible which is charged with a SiC source material and a SiC seed crystal in spaced relation; (b) providing in the growth ambient a reactive atmosphere comprising gaseous species capable of chemical binding of donor and/or acceptor background impurities present in the growth ambient and removing said impurities from said growth ambient by means of chemical binding; (c) sublimating the SiC source material and transporting the sublimated SiC source material to the SiC seed crystal and precipitating the sublimated SiC source material on the SiC seed crystal causing growth of a SiC single crystal on the SiC seed crystal, while simultaneously removing donor and/or acceptor background impurities from the growth ambient by means of the chemical binding; and (d) following step (c), introducing vanadium and boron dopants into the growth ambient thereby forming fully compensated, semi-insulating SiC single crystal of PI-type co-doped with vanadium and boron.

The semi-insulating SiC single crystal of PI-type co-doped with vanadium and boron includes one or more of the following: intentionally reduced levels of background donors and acceptors; a shallow acceptor intentionally introduced in step (d) in a concentration exceeding the summary concentration of the residual donors; vanadium intentionally introduced in step (d) in a concentration sufficient to achieve full compensation; and/or a resistivity of at least $10^{11}$ Ohm-cm at room temperature and activation energy of resistivity of about 0.9-1.5 eV in the temperature range between room temperature and 400° C.

The vanadium and boron dopants can be introduced into the growth ambient via a capsule made of an inert material that is introduced into the growth ambient following step (c). The capsule can be made of graphite. The capsule can include at least one calibrated capillary serving as escape pathway for vapors of at least one of the dopants.

Prior to step (d) the capsule with the dopants can be stored outside the growth crucible at a relatively low temperature. In step (d) the capsule with the dopants is moved into the growth crucible.

The dopants can be elemental vanadium and boron or a boron compound, such as, without limitation, vanadium di-boride, VB$_2$.

Also disclosed is an apparatus for sublimation growth of fully compensated, semi-insulating SiC single crystals of PI-type comprising: (a) a furnace chamber holding a growth crucible that charged with SiC source material and a SiC seed crystal in spaced relation; (b) a gas distribution system to supply a flow of gas mixture into the furnace chamber, said gas mixture forming a reactive atmosphere in the furnace chamber at elevated temperatures capable of chemical binding to donor and/or acceptor background impurities in a SiC growth ambient that includes the furnace chamber and the growth crucible, leading to removal of said background impurities from said growth ambient by means of chemical binding; (c) a doping capsule including dopants in the capsule; and (d) means for moving the capsule with dopants between a position outside said the growth crucible at relatively low temperatures during removal of background impurities and to a position inside the growth crucible during growth of the SiC crystal of PI-type.

The doping capsule can be made of inert material, such as graphite. The doping capsule can include at least one calibrated capillary as an escape pathway for vapors of the dopants.

The dopants can be elemental vanadium and boron, or vanadium compounds and boron compounds. The dopants can be elemental vanadium and vanadium di-boride, VB$_2$.

Also disclosed is a fully compensated with vanadium, semi-insulating SiC single crystal of PI-type having a room-temperature resistivity of at least $10^{11}$ Ohm-cm and an activation energy of resistivity in the range between approximately 0.9 and 1.5 eV in the temperature range between room temperature and 400° C.

The PI-type SiC single crystal can include: shallow acceptors, shallow donors and vanadium, said shallow acceptors present in larger concentrations than shallow donors, and said vanadium present in concentrations sufficient to achieve full compensation and a room-temperature resistivity of at least $10^{11}$ Ohm-cm and an activation energy of resistivity of about 0.9-1.5 eV in the temperature range between room temperature and 400° C.

The PI-type SiC single crystal can include: background nitrogen impurity in a concentration between $4 \cdot 10^{15}$ and $7 \cdot 10^{15}$ atoms-cm$^{-3}$, and intentionally introduced boron and vanadium dopants in concentrations between $9 \cdot 10^{15}$ to $2 \cdot 10^{16}$ atoms-cm$^{-3}$ and $9 \cdot 10^{16}$ to $2 \cdot 10^{17}$ atoms-cm$^{-3}$, respectively.

The PI-type SiC single crystal can include: intentionally introduced boron and vanadium dopants and having a room-temperature resistivity of at least $1 \cdot 10^{10}$ Ohm-cm and, more desirably, between $1 \cdot 10^{11}$ and $1 \cdot 10^{21}$ Ohm-cm, and an activation energy of the resistivity of approximately 0.9-1.5 eV in the temperature range between room temperature and 400° C.

The PI-type SiC single crystal can be of 4H or 6H polytype.

Also disclosed is a method of forming a fully compensated, semi-insulating SiC single crystal of NU-type comprising: (a) providing a SiC growth ambient that includes a growth crucible and a furnace chamber to hold the growth crucible, said growth crucible charged with SiC source and a SiC seed crystal in spaced relation; (b) providing a reactive atmosphere in the growth ambient, said reactive atmosphere comprising gaseous species capable of chemical binding of donor and/or acceptor background impurities present in the growth ambient and removing said impurities from said growth ambient by means of chemical binding; (c) in the presence of said reactive atmosphere, sublimating the source material, whereupon the sublimated SiC source material transports to and precipitates on the SiC seed crystal causing growth of a SiC single crystal on the SiC seed crystal, while simultaneously said reactive atmosphere removes donor and/or acceptor background impurities from the growth ambient by means of chemical binding; and (d) following step (c), introducing vanadium and nitrogen dopants into the growth ambient and forming fully compensated, semi-insulating SiC single crystal of NU-type co-doped with vanadium and nitrogen having one or more of the following: intentionally reduced levels of background donors and acceptors; a shallow donor intentionally introduced in step (d) in a concentration exceeding the summary concentration of the residual acceptors; vanadium intentionally introduced in step (d) in a concentration sufficient to achieve full compensation; and/or a resistivity of at least $10^{10}$ Ohm-cm at room temperature and activation energy of resistivity of about 0.78-0.82 eV in the temperature range between room temperature and 400° C.

The vanadium dopant can be contained in a capsule made of an inert material, such as graphite. The capsule can include at least one calibrated capillary serving as an escape pathway for vapors of the dopant.

Prior to step (d), the capsule with the vanadium dopant can be stored outside the growth crucible at a relatively low temperature. In step (d), the capsule can be brought into the growth crucible.

The dopants can be elemental vanadium and nitrogen, or vanadium compounds and nitrogen.

Also disclosed is an apparatus for sublimation growth of fully compensated, semi-insulating SiC single crystals of NU-type comprising: (a) a furnace chamber holding a growth crucible charged with SiC source material and a SiC seed in spaced relation; (b) a gas distribution system to supply a flow of gas mixture into the furnace chamber, said gas mixture forming a reactive atmosphere in the furnace chamber capable of chemical binding at elevated temperatures to background donor and/or acceptor impurities in an SiC growth ambient leading to removal of said impurities from said growth ambient by means of chemical binding; (c) a doping capsule including vanadium dopant in the capsule; and (d) means for moving the doping capsule with vanadium dopant between a position outside the crucible at relatively low temperatures during removal of background impurities and to a position inside the growth crucible during growth of the SiC crystal of NU-type.

The doping capsule can be made of inert material, such as graphite. The doping capsule can include at least one calibrated capillary serving as an escape pathway for vapors of the vanadium dopant.

The capsule can include elemental vanadium or vanadium compounds.

Also disclosed is a fully compensated, semi-insulating SiC single crystal of NU-type having a room-temperature resistivity of at least $10^{10}$ Ohm-cm and an activation energy of resistivity between approximately 0.78 and 0.82 eV in the temperature range between room temperature and 400° C.

The NU-type SiC single crystal can include: shallow acceptors, shallow donors and vanadium, said shallow donors present in larger concentrations than shallow acceptors, and said vanadium present in concentrations sufficient to achieve a room-temperature resistivity of at least $10^{10}$ Ohm-cm and an activation energy of resistivity of approximately 0.78-0.82 eV in the temperature range between room temperature and 400° C.

The NU-type SiC single crystal can include: background boron in concentrations between $2 \cdot 10^{15}$-$8 \cdot 10^{15}$ atoms-$cm^{-3}$ and intentionally introduced nitrogen and vanadium in concentrations between $8 \cdot 10^{15}$-$2 \cdot 10^{16}$ atoms-$cm^{-3}$ and $9 \cdot 10^{16}$-$2 \cdot 10^{17}$ atoms-$cm^{-3}$, respectively.

The NU-type SiC single crystal can include: intentionally introduced nitrogen and vanadium and having a room-temperature resistivity of at least $1 \cdot 10^{10}$ Ohm-cm and, more desirably, of at least $1 \cdot 10^{11}$ Ohm-cm, and an activation energy of the resistivity of 0.78-0.82 eV in the temperature range between room temperature and 400° C.

The NU-type SiC single crystal can be of 4H or 6H polytype.

BRIEF DESCRIPTION OF THE DRAWINGS

FIGS. 5A and 5B are isolated schematic views of the growth crucibles of FIGS. 4 and 7 showing movement of a dopant capsule from a position outside the growth crucible to a position inside the growth crucible;

FIGS. 6A and 6B are different embodiments of a doping capsule that include a single compartment and separate compartments, respectively, for dopants, wherein each doping capsule can be used separately with the SiC crystal growth apparatuses shown in FIGS. 4 and 7.

DETAILED DESCRIPTION OF THE INVENTION

The SiC growth process described hereinafter incorporates conventional elements of the prior art, such as the use of halogen-purified graphite, pre-growth vacuum outgassing and growth under continuous purge with high-purity inert gas. In addition, the SiC growth process described hereinafter comprises the following novel elements:

1. Growth in a reactive atmosphere leading to removal of residual background nitrogen and boron from the growth ambient by chemical binding.

2. A two-stage process for the growth of SI SiC crystals of PI-type comprising removal of background nitrogen (N) and background boron (B) from the growth ambient in stage (a) followed by growth using controlled co-doping of the growing crystal with vanadium (V) and B in stage (b).

3. A two-stage process for the growth of SI SiC crystals of NU-type comprising removal of N and B from the growth ambient in stage (a) followed by growth using controlled co-doping of the growing crystal with V and N in stage (b).

Growth of High Purity SiC Crystals

The concept of SiC sublimation growth under reactive atmosphere is disclosed in U.S. Pat. No. 8,361,227 (hereinafter "the '227 patent"), which is incorporated herein by reference. The patent discloses in-situ purification of the graphite growth cell from boron by supplying into the SiC growth ambient a gas mixture that includes halo silane gas.

The SiC growth process described hereinafter improves on the in-situ purification method disclosed in the '227 patent. Specifically, the SiC growth method disclosed herein comprises removal of both boron and nitrogen from the growth ambient via SiC sublimation growth in the presence of a reactive atmosphere that includes molecular species capable of binding with gaseous nitrogen and carbon-bound boron. This reactive atmosphere comprises volatile reactive species of gaseous metal halide and hydrogen ($H_2$). The gaseous metal halide is chosen from the group of $TaCl_5$, $TaF_5$, $NbCl_5$ and $NbF_5$. Desirably, the gaseous metal halide is tantalum pentachloride, $TaCl_5$.

A flow of inert gas, such as argon (Ar), brings the gaseous metal halide and $H_2$ into the SiC growth cell, where they participate in chemical reactions, including reactions between themselves, as well as reactions with the gaseous nitrogen impurity and carbon-bound boron impurity.

Figure 2:
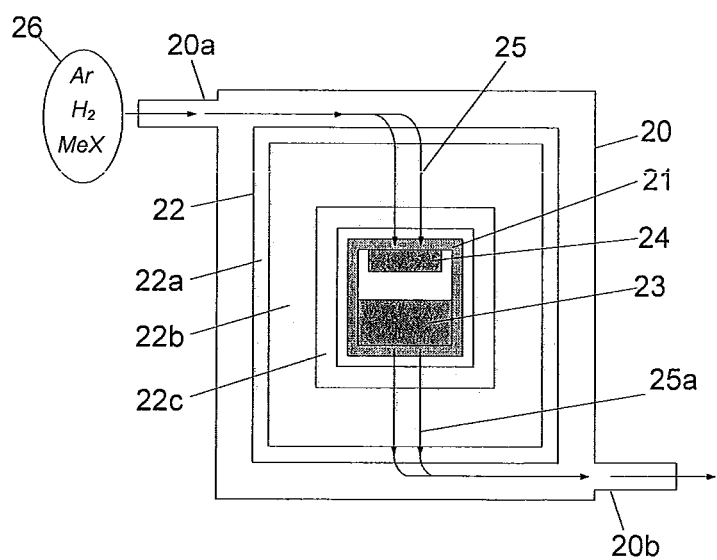
FIG. 2 is a schematic of a SiC sublimation growth cell that includes a chamber, that has a gas inlet and a gas outlet, and which holds a crucible surrounded by thermal insulation, wherein SiC source material and a SiC crystal which grows on a SiC seed crystal are shown disposed inside the crucible.

FIG. 2 shows a schematic of a SiC sublimation growth cell that includes a chamber 20, having gas inlet 20a and outlet 20b, holding graphite crucible 21 surrounded by thermal insulation 22. SiC source 23 and SiC crystal 24 which grows on a SiC seed crystal 24a are shown disposed inside crucible 21 in spatial relationship typical for SiC sublimation growth.

Gas mixture 26, which enters through the inlet 20a, includes an inert gas, desirably Ar mixed with $H_2$, and a vapor of volatile halide compound designated as MeX. Element X is a halogen chosen from the group of fluorine, F, and chlorine, Cl. Me is a metal chosen from the group of tantalum, Ta, and niobium, Nb. Desirably, the volatile metal halide is tantalum pentachloride, $TaCl_5$. Upon entering chamber 20, gas mixture 26 creates reactive atmosphere inside chamber 20.

Thermal insulation 22 is made of light-weight fibrous graphite, which is fully permeable to gases. After entering chamber 20, gas mixture 26 permeates the bulk of thermal insulation 22, as shown schematically in FIG. 2 by arrows 25.

The temperature inside the thermal insulation 22 is spatially nonuniform. On the outer surface, which is in proximity to the water-cooled wall of the chamber 20, the temperature can be as low as 200-300° C. An outer layer 22a of thermal insulation where the temperature during SiC growth is between 300 and 500° C., approximately, is schematically shown in FIG. 2. On the interior surface of an inner layer 22c of thermal insulation, which is in proximity to the crucible 21, the temperature is close to the SiC sublimation temperature (2000-2400° C.). The inner layer 22c of thermal insulation, where the temperature is higher than 900° C., approximately, is shown in FIG. 2. An intermediate layer 22b of thermal insulation 22, where the temperature is between 500 and 900° C., approximately, is shown in FIG. 2.

Performed thermodynamic calculations showed that chemical reactions between the gaseous species of the reactive atmosphere (MeX, $H_2$), nitrogen ($N_2$) and boron proceed through several steps. In the first step, as gas mixture 26 permeates the outer layer 22a of thermal insulation, said outer layer 22a situated at temperatures approximately between 300 and 500° C., the gaseous metal halide (MeX) reacts with $H_2$ according to the following reaction (1) (reaction (1) is written without stoichiometric coefficients):

Reaction (1) is, in essence, CVD deposition of metal Me, and it yields elemental metal in the form of solid precipitate, Me↓. This reaction is partial and does not consume the entire amount of gaseous metal halide present in the reactive atmosphere.

In the second step, which follows the first step and which occurs as gas mixture 26 carrying the remaining metal halide vapor permeates the intermediate layer 22b of thermal insulation, said intermediate layer 22b situated at temperatures approximately between 300 and 900° C., gaseous metal halide reacts with hydrogen and nitrogen according to the following reaction (2) (reaction (2) is written without stoichiometric coefficients):

where MeN↓ is a precipitate of solid metal nitride MeN. This reaction leads to the removal of residual $N_2$ from the atmosphere by binding nitrogen into solid metal nitride, MeN. Reaction (2) is, in essence, CVD deposition of metal nitride MeN. The residual nitrogen in reaction (2) comes from $N_2$ released into the furnace chamber 20 from graphite parts, such as graphite crucible 21 and thermal insulation 22.

In the third step which follows the second step, the gas mixture 26 carrying the remaining metal halide vapor moves to inner layer 22c of thermal insulation, said inner layer 22c situated at temperatures above 900° C., the remaining metal halide reacts with hydrogen and carbon of thermal insulation to form metal carbide according to the following reaction (3) (reaction (3) is written without stoichiometric coefficients):

where MeC↓ is a precipitate of solid metal carbide. Reaction (3) is, in essence, CVD deposition of metal carbide, MeC.

All three aforementioned reactions produce gaseous hydrogen halide, HX, as a byproduct. Driven by the flow of gas mixture 26 into chamber 20 and diffusion, gaseous hydrogen halide permeates the bulk (the walls, the lid, and the base) of graphite crucible 21 situated at temperatures between 2000 and 2400° C., where said gaseous hydrogen halide reacts with carbon-bound boron and converts it into volatile boron halides according to the following reaction (4) (reaction (4) is written without stoichiometric coefficients):

where BC symbolizes carbon-bound boron, $BX_n\uparrow$ symbolizes volatile boron-halogen molecular associates and $CH_m\uparrow$ symbolizes gaseous hydrocarbons. In the case of hydrogen chloride, HCl, the dominant products of reaction (4) are BCl, $BCl_2$ and $C_2H_2$.

The volatile products of reactions (1)-(4) are removed from the crystal growth cell and then from the chamber by the flow of gas mixture 26 into chamber 20, as symbolized by arrows 25a in FIG. 2.

Due to reactions (1)-(3), the bulk of thermal insulation 22, becomes coated with thin deposits of metal, metal nitride and metal carbide. Such coatings reduce to some degree the ability of the insulation 22 to absorb gases, but they do not affect adversely thermal properties of said insulation.

At high temperatures of SiC sublimation growth (2000-2400° C.), gaseous hydrogen halide also reacts with silicon carbide leading to the appearance of volatile silicon-halogen and hydrocarbon molecular associates according to the following reaction (5) (reaction (5) is written without stoichiometric coefficients):

where $SiX_m\uparrow$ symbolizes volatile silicon halides and $CH_n\uparrow$ symbolizes gaseous hydrocarbons. In the case of hydrogen chloride, HCl, the dominant products of reaction (5) are $SiCl_2$ and $C_2H_2$. In practical terms, the yield of reaction (5) is insignificant, and no noticeable silicon or carbon losses from the crucible occur.

Figure 3:
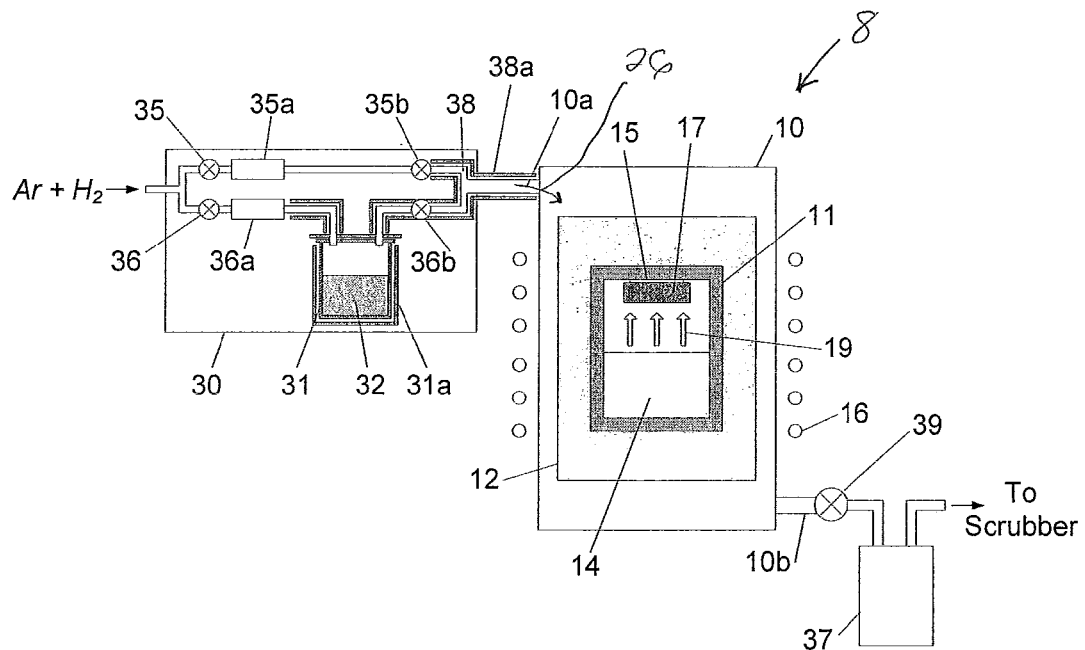
FIG. 3 is a schematic illustration of one embodiment SiC crystal growth apparatus for growth of high-purity SiC crystals.

FIG. 3 shows a SiC crystal growth apparatus for the growth of high-purity SiC crystals. In one desirable, non-limiting embodiment, the metal halide used for the removal of nitrogen and boron from the growth ambient is tantalum pentachloride, $TaCl_5$.

Figure 1:
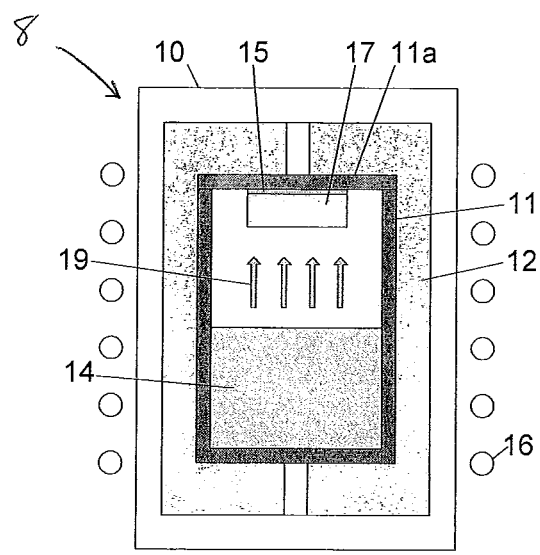
FIG. 1 is a schematic drawing of a prior art physical vapor transport (PVT) growth cell.

With reference to FIG. 3, the growth process is carried out in a growth cell 8 (e.g., the growth cell 8 of FIG. 1) which includes a chamber 10, which includes growth crucible 11 and thermal insulation 12. Growth crucible 11 is made of dense, fine-grain, isostatically-molded graphite, such as "ATJ" available from UCAR Carbon Company of New York, N.Y. Thermal insulation 12 is made from light-weight, fibrous graphite, such as Calcarb® CBCF available from Mersen USA, St. Mary's, PA. Prior to use in SiC growth, all graphite parts and components are commercially halogen-purified to the total ash level of 5 ppm by weight. At present, this is the purest graphite available commercially.

Growth crucible 11 is charged with SiC sublimation source 14 disposed at the crucible bottom and SiC seed crystal 15 disposed at the crucible top. RF coil 16 provides heating to growth crucible 11. Upon reaching SiC sublimation growth temperatures between 2000 and 2400° C., source 14 vaporizes and fills the interior of crucible 11 with SiC vapors 19 that include volatile molecules of $Si_2C$, $SiC_2$ and Si. Driven by temperature gradients, the SiC vapors 19 migrate towards $Ar+H_2$ mixture mixes with the $TaCl_5$ vapor and carries it through the valve 36b to manifold 38. Valve 36b and manifold 38 are heated by flexible tape-heaters 38a to a temperature equal or above that of the vessel 31 and, desirably, to a temperature between 100 and 200° C.

The main flow of the $Ar+H_2$ mixture is supplied through the valve 35, mass flow controller 35a and valve 35b to manifold 38 at a flow rate, desirably, between 50 and 300 sccm. The gaseous byproducts of the reactions taking place in chamber 10 flow through an outlet 10b, a valve 39 and vacuum pump 37 to a scrubber (not shown) for neutralization.

Results of high-purity 6H SiC growth runs carried out in the apparatus shown in FIG. 3 are shown in the following Table 1. The nitrogen concentration in grown SiC single crystal 17 was between $4·10^{15}$ and $7·10^{15}$ cm$^{-3}$, and the boron concentration was between $2·10^{15}$ and $8·10^{15}$ cm$^{-3}$. Compared to the prior art, a 4-10 fold reduction in the levels of background N and B in SiC single crystals 17 were observed.

TABLE 1

| Crystals | Type of Growth | Impurity Content, cm$^{-3}$ | | | | | | Rho @ RT, Ohm-cm | | Activation Energy of Resistivity (RT-400° C.) eV |
|---|---|---|---|---|---|---|---|---|---|---|
| | | Nitrogen | | Boron | | Vanadium | | | | |
| | | Background | Introduced | Background | Introduced | Background | Introduced | Measured | Extrapolated | |
| 6H | Prior Art | 8e15-1e17 | | 8e15-3e16 | | | 9e16-2e17 | 1e5-2e11 | | Variable |
| 6H | High Purity | 4e15-7e15 | | 2e15-8e15 | | <1e14 | | 1e3-1e7 | | Variable |
| 6H | PI-Type | 4e15-7e15 | | | 8e15-2e16 | | 9e16-2e17 | | 1e12-1e21 | 0.9-1.5 |
| 4H | Pi-Type | | | | | | | | 1e14-1e18 | 1.1-1.5 |
| 6H | Nu-Type | | 8e15-2e16 | 2e15-8e15 | | | | (1-2)e11 | | 0.78-0.80 |
| 4H | Nu-Type | | | | | | | (2-4)e11 | | 0.79-0.82 | seed 15, as symbolized by arrows 19, and precipitate on SiC seed crystal 15 causing growth of SiC single crystal 17 on SiC seed crystal 15.

The SiC growth apparatus of FIG. 3 includes gas delivery system 30, which serves to generate the vapor of metal halide, mix the vapor with the carrier gas ($Ar+H_2$) and bring the gas mixture 26 into the furnace chamber 10 through a heated inlet 10a. This gas mixture has the following composition: $H_2$ (desirably, between 2 and 5% by volume), $TaCl_5$ vapor (desirably, between 100 and 1000 ppm by volume), Ar (the balance). Argon pre-mixed with hydrogen to a desired level can be used as a carrier gas.

The pressure and the flows of the gaseous components are controlled using means known in the art, e.g., U.S. Pat. No. 6,410,433, such as upstream valves 35 and 36, mass flow controllers 35a, 36a, valves 35b and 36b, downstream valve 39 and vacuum pump 37. Other common and conventional parts of the gas delivery system, such as pressure gauges, solenoid valves, filters, electronic control, etc. are not shown. During growth of SiC single crystal 17, the total pressure in chamber 10 is maintained, desirably, between 5 and 50 Torr.

In FIG. 3, the source of gaseous $TaCl_5$ is solid tantalum pentachloride 32, which is contained in a sealed vessel 31 having an interior volume of about 100 cm$^3$. Vessel 31 is made of corrosion resistant alloy, such as type 316 stainless steel, and is heated by a heater 31a to create a spatially uniform temperature distribution in the vessel. During growth of SiC single crystal 17, the temperature of vessel 31 is maintained, desirably between 75 and 120° C. At these temperatures, solid $TaCl_5$ vaporizes and generates a $TaCl_5$ vapor pressure between 0.1 and 1 Torr.

The $Ar+H_2$ mixture is supplied into vessel 31 at a flow rate, desirably, between 20 and 50 sccm. Inside vessel 31, the Growth of SI SiC Single Crystals of PI-Type The growth process for SI SiC single crystals of PI-type includes two phases, phase (a) and phase (b). Phase (a) is growth under reactive atmosphere aimed at removal of background N and B from the growth ambient, as described above in connection with FIG. 3. The duration of phase (a) of the growth process is, desirably, between 12 and 24 hours. Phase (b) of the process is growth of the final product—fully compensated, semi-insulating PI-type SiC single crystal—said growth carried out using co-doping with V (vanadium) and B (boron).

Figure 4:
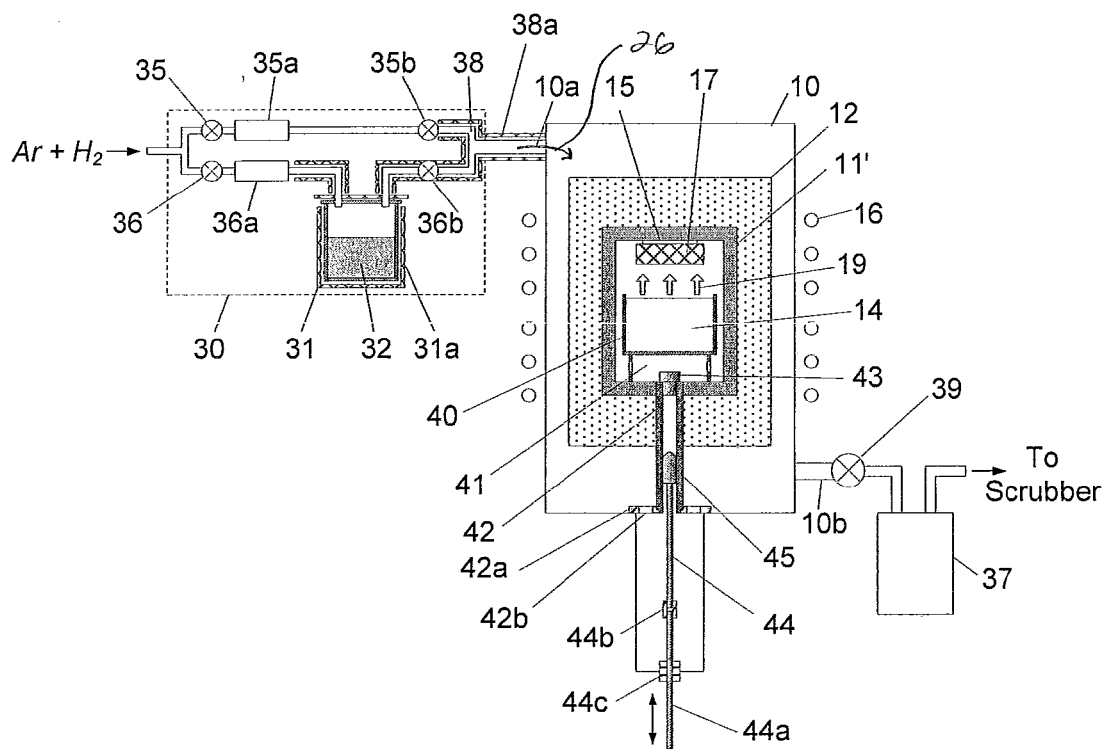
FIG. 4 is a schematic illustration of another embodiment SiC crystal growth apparatus for growing SiC crystals of PI-type.

FIG. 4 shows a SiC crystal growth apparatus for growth of SiC crystals of PI-type. The apparatus is similar to the one shown in FIG. 3, with the exception of the growth crucible 11'. The presence of vanadium and boron dopants in the heated growth crucible during phase (a) of the process is undesirable. Therefore, growth crucible 11' was devised to permit vanadium and boron dopants to be stored at low temperatures during phase (a) and be subsequently brought into the growth crucible in phase (b). Details regarding growth crucible 11' and its operation are shown in FIGS. 5A and 5B.

With reference to FIGS. 4, 5A and 5B, growth crucible 11' is made of dense, fine grain graphite and has a graphite tube 42 attached, i.e., at the bottom. Desirably, the outside diameter of tube 42 is between 30 and 40 mm, while the inner diameter is between 15 and 20 mm. A doping capsule 45 containing the dopant(s) is disposed inside the tube 42 on pushrod 44. Desirably, doping capsule 45 and pushrod 44 are made of an inert material, such as graphite. The prior art use of a doping capsule is disclosed in U.S. Pat. No. 7,608,524 and U.S. Pat. No. 8,216,369, both of which are incorporated herein by reference.

As shown in FIG. 4, tube 42 is supported in the chamber by a structure 42a that has an opening 42b that facilitates evacuation and back filling of the inner space of chamber 10 with process gases. Tube 42, doping capsule 45 and pushrod 44 are included in chamber 10 and are exposed to the same pressure and flows of gaseous components as chamber 10.

At its bottom, graphite pushrod 44 is connected to a metal pushrod 44a using means known in the art, such as threading. The threaded union between graphite pushrod 44 and metal pushrod 44a is shown schematically as item 44b in FIG. 4. Metal pushrod 44a extends to the exterior of the chamber 10 and is sealed via a seal 44c, which forms a vacuum-tight, linear motion feed-through. Seal 44c can be an O-ring seal, a Ferrofluidic linear motion feed-through (e.g., available from FerroTec, Inc. 33 Constitution Drive Bedford, N.H., USA 03110), or a bellows-based vacuum feed-through (e.g., available from Standard Bellows Company, 375 Ella T. Grasso Turnpike, Windsor Locks, Conn., USA 06096).

During growth of SiC single crystal 17, the total pressure in chamber 10, including Tube 42, doping capsule 45 and pushrod 44, is maintained, desirably, between 5 and 50 Torr.

In phase (a) of the process, where growth is carried out in crucible 11' in the manner described above in connection with FIG. 3, doping capsule 45 is disposed at a distance from crucible 11', while the opening of tube 42 is sealed with graphite plug 43, as shown in FIG. 5a, Desirably, the substantially undoped portion of SiC single crystal 17 grown during phase (a) is a sacrificial portion. Due to the distance between doping capsule 45 and heated crucible 11', the temperature of the doping capsule 45 is lower than that of the crucible 11'. Desirably, the temperature of the doping capsule 45 during phase (a) of the process does not exceed 1000° C.

SiC source material 14 is disposed in a source crucible 40 at a distance from the bottom of the crucible 11' via one or more standoffs 46 that are configured to permit the doping vapors 56 (discussed hereafter) to migrate toward the top of crucible 11', thus forming a gap or free space 41. Source crucible 40 also forms an annular gap 41a between the outer diameter of the source crucible 40 and the inner diameter of the crucible 11'. During phase (b) of the process, free space 41 and annular gap 41a serve as conduits for doping vapors 56 to reach the growing SiC single crystal 17.

Two non-limiting embodiments of doping capsule 45 are shown in FIGS. 6A and 6B. FIG. 6A is a doping capsule 45a that includes a single compartment 63 for a single dopant 62, for instance, vanadium, while FIG. 6B is a doping capsule 45b that includes two compartments 63a and 63b for two separate dopants 62a and 62b, for instance, vanadium and boron. Each doping capsule 45a and 45b has tapered top 60. Doping capsule 45a has at least one calibrated capillary 61 in communication with compartment 63 serving as a passageway for doping vapors 56. Doping capsule 45b has at least two calibrated capillaries 61a and 61b in communication with compartments 63a and 63b serving as passageways for the doping vapors 56a and 56b.

The principle of operation of each capsule 45a and 45b is based on the well-known phenomenon of effusion, i.e., the slow escape of vapor from a sealed vessel through a small orifice. At high temperatures, the vapor pressure of dopant (62, 62a, or 62b) inside of its space (63, 63a, or 63b) forces the vapor (56, 56a, or 56b) to escape via each capillary (61, 61a, or 61b) in communication with the corresponding space. If the cross section of each capillary is sufficiently small, the vapor pressure of the doping vapors in the capsule does not differ substantially from an equilibrium value.

The laws of effusion are well known and, for given growth conditions, temperature, vapor pressure of inert gas, volatility of the dopant (62, 62a, or 62b), and the diameter and/or length of the capillary (61, 61a, or 61b), the flux of molecules of doping vapors 56, 56a, or 56b escaping the corresponding capsule via the corresponding capillary can be readily calculated. Thus, the dimension of each capillary and the number of capillaries in communication with each space (63, 63a, and/or 63b) can be tailored to achieve a steady and well-controlled flux of doping vapors from the capsule to the growing SiC crystal 17.

Referring back to FIG. 4 and with continuing reference to FIGS. 5A-6, at the completion of phase (a) of the process described above in connection with FIG. 3, valves 36 and 36b of the gas delivery system 30 are closed, thus stopping the flow of metal halide vapor into the furnace chamber 10.

Following termination of the flow of metal halide vapor into the furnace chamber 10, doping capsule 45 i.e., either doping capsule 45a or doping capsule 45b, is moved upward (FIG. 5B) via upward movement of pushrod 44. In FIG. 4, the upward movement of pushrod 44 is accomplished via upward movement of the pushrod 44a through the vacuum seal 44c, said seal operational to preserve the integrity of the atmosphere in the chamber 10. The outside diameter of the doping capsule is sized to the inside diameter of tube 42, so that the doping capsule can be moved via push rod 44 without undue force. The tapered top 60 of the doping capsule pushes plug 43 out of the end of tube 42, thus bringing the doping capsule into the crucible interior, as shown in FIG. 5B. The outside diameter of the doping capsule is sized to the inside diameter of tube 42, so that the doping capsule can be moved via push rod 44 without undue force. The tapered top 60 of the doping capsule pushes plug 43 out of the end of tube 42, thus bringing the doping capsule into the crucible interior, as shown in FIG. 5B.

During phase (b) of the growth process, co-doping of the growing SiC single crystal 17 with vanadium and boron takes place. The dopant(s) are chosen from a group that includes, without limitation, elemental vanadium, elemental boron, vanadium carbide ($VC_{0.9}$), boron carbide ($B_4C$), vanadium boride (VB) and/or vanadium diboride ($VB_2$).

In one embodiment, for vanadium-boron co-doping, doping capsule 45a is used. Alternatively, doping capsule 45b can be used with vanadium and boron in spaces 63a and 63b, respectively, or vice versa. Doping capsule 45a comprises a single capillary which is 1 mm in diameter and 6 mm long. The single-compartment 63 in doping capsule 45a contains vanadium metal as a source of vanadium and vanadium diboride, $VB_2$, as a source of boron. Vanadium diboride is taken in the weight ratio to vanadium, desirably, between 1 and 10%.

Results of growth runs aimed at producing vanadium-compensated, semi-insulating PI-type 6H SiC crystals are shown in Table 1 above. Based on SIMS impurity analysis, the grown crystals included between $4 \cdot 10^{15}$ and $7 \cdot 10^{15} CM^3$ of unintentional background nitrogen. The levels of intentionally introduced boron and vanadium were between $9 \cdot 10^{15}$ and $2 \cdot 10^{16}$ cm$^3$ and between $9 \cdot 10^{16}$ and $2 \cdot 10^{17}$ cm$^3$, respectively.

The resistivity of the wafers sliced from the grown SI SiC crystals was measured at room temperature using COREMA, a non-contact capacitance-based instrument. The results were, typically, above the measurement limit of $1 \cdot 10^{12}$ Ohm-cm of the instrument. In order to approximately estimate the room-temperature resistivity, the wafers were measured at elevated temperatures between 100 and 400° C. using a Variable Temperature version of COREMA (VT-COREMA). The results were extrapolated to room temperature, yielding room-temperature resistivity values on the order of $10^{12}$-$10^{21}$ Ohm-cm with the activation energies between about 0.9 and 1.5 eV. This indicated PI-type with full compensation of boron shallow acceptors by vanadium.

Growth of SI SiC Single Crystals of NU-Type

In similarity to the growth of semi-insulating SI SiC single crystals of PI-type, the growth process for SI SiC crystals of NU-type also includes two phases. Phase (a) of the process is growth of substantially undoped, sacrificial portion of the SiC single crystal under reactive atmosphere aimed at removal of background N and B from the growth ambient. Phase (a) of the growth process is carried out as described above in connection with FIG. 3. The duration of phase (a) is, desirably, between 12 and 24 hours. Phase (b) of the process is growth of NU-type SiC using co-doping with V (vanadium) and N (nitrogen).

Figure 7:
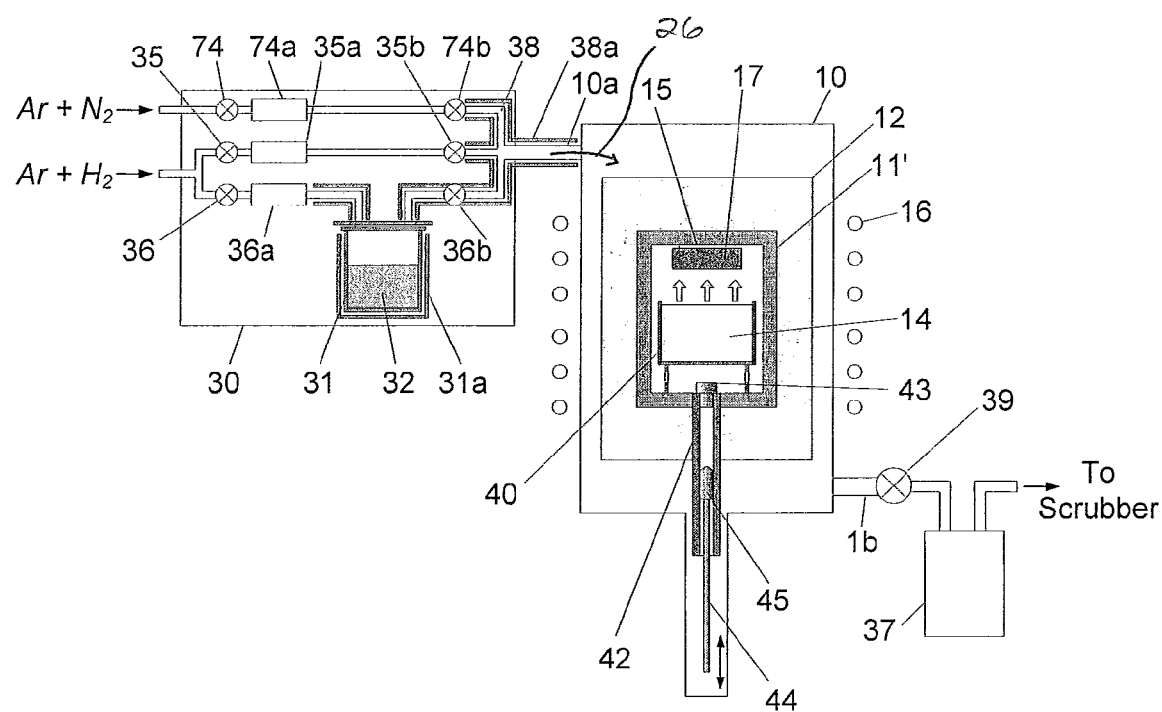
FIG. 7 is a schematic illustration of another embodiment SiC crystal growth apparatus for growing SiC crystals of NU-type.

FIG. 7 shows a SiC crystal growth apparatus for the growth of semi-insulating SiC single crystals of NU-type. The apparatus shown in FIG. 7 is similar to the one shown in FIG. 4, with the exception of gas delivery system 30. For simplicity of illustration, pushrod 44a, vacuum seal 44c, threading 44b, and structure 42a including opening 44b have been omitted from FIG. 7. However, it is to be appreciated these elements or their equivalents would also present in the apparatus shown in FIG. 7. In order to achieve precise co-doping with nitrogen, gas delivery system 30 includes an additional gas line comprising valves 74, 74b and mass flow controller 74a which is not required for the gas delivery system 30 of FIG. 4. Other than the addition of the gas line comprising valves 74, 74b, and mass flow controller 74a, the SiC crystal growth apparatus shown in FIG. 7 is the same as the SiC crystal growth apparatus shown in FIG. 4. Accordingly, details regarding the elements common to the SiC crystal growth apparatuses shown in FIGS. 4 and 7 will not be described further herein to avoid unnecessary redundancy.

An Ar+N$_2$ gas mixture is supplied to valve 74. The concentration of N$_2$ in the Ar+N$_2$ gas mixture is, desirably, between 50 and 200 ppm by volume.

In one embodiment, metallic vanadium is used as a dopant. During growth of SiC single crystal 17, vanadium is disposed in doping capsule 45a shown in FIG. 6A. Doping capsule 45a comprises a single capillary 61 which is 1 mm in diameter and 6 mm long.

With ongoing reference to FIG. 7, the growth process for vanadium-compensated SiC single crystals 17 of NU-type is carried out as follows. At the completion of phase (a) of the process, described above in connection with FIG. 3, valves 36 and 36b are closed, thus stopping the flow of metal halide vapor into furnace chamber 10. Recall that during phase (a) of the process, Ar+H$_2$ flows into furnace chamber 10 via valves 35 and 35b and mass flow controller 35a. Desirably, the portion of SiC single crystal 17 grown during phase (a) is a sacrificial portion.

In phase (b) of the process and following termination of the flow of metal halide vapor into furnace chamber 10, valves 74 and 74b are opened, and the mass flow controller 74a is activated allowing the Ar+N$_2$ mixture to flow into the furnace chamber 10 with the flow of Ar+H$_2$. Desirably, the flow of the Ar+N$_2$ mixture is between 1 and 10% of the flow of the Ar+H$_2$ mixture.

Following this, doping capsule 45a is moved upward using pushrod 44. The tapered top of doping capsule 45a pushes plug 43 out of the tube 42, thus bringing doping capsule 45a into the crucible interior, as shown for example in FIG. 5B.

Results of the growth runs of vanadium-compensated, SI SiC crystals of NU-type are shown in Table 1 above. Based on SIMS impurity analysis, the grown SI SiC single crystals included between $2 \cdot 10^{15}$ and $8 \cdot 10^{15}$ cm$^{-3}$ of unintentional background boron. The levels of intentionally introduced nitrogen and vanadium were between $8 \cdot 10^{15}$ and $2 \cdot 10^{16}$ cm$^3$ and $9 \cdot 10^{16}$ and $2 \cdot 10^{17}$ cm$^3$, respectively.

The resistivity of the wafers sliced from the grown SI SiC crystals was measured at room temperature using COREMA. The resistivity values were between $1 \cdot 10^{11}$ Ohm-cm and $4 \cdot 10^{11}$ Ohm-cm. The activation energy of resistivity in the temperature range between 25 and 400° C. measured using VT COREMA was between 0.78 and 0.82 eV. This pointed to NU-type with full compensation of nitrogen shallow donors by vanadium.

The present invention has been described with reference to the accompanying figures. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A crystal growth method comprising:
   (a) providing a SiC single crystal seed and a polycrystalline SiC source material in spaced relation inside of a growth crucible that is disposed inside of a furnace chamber, the growth crucible disposed inside of a furnace chamber defining a growth ambient; and
   (b) sublimation growing a SiC single crystal on the SiC seed crystal via precipitation of sublimated SiC source material on the SiC seed crystal; and
   (c) causing a reactive atmosphere to form in the growth ambient that reacts with background nitrogen and boron present in the growth ambient forming a solid nitride compound with the background nitrogen and a gaseous boron halide compound with the background boron.

2. The method of claim 1, wherein the reactive atmosphere includes a halide vapor compound and one or more gases.

3. The method of claim 2, wherein:
   the halide vapor compound is comprised of (1) fluorine or chlorine, and (2) tantalum or niobium; and
   the one or more gases includes argon, hydrogen, or a mixture of argon+hydrogen.

4. The method of claim 2, further including:
   (d) following step (c), changing the atmosphere in the growth ambient to a non-reactive atmosphere; and
   (e) following step (d), introducing into the growth ambient a vanadium dopant that causes the portion of the SiC single crystal sublimation growing on the SiC seed crystal after step (d) to be fully compensated and semi-insulating.

5. The method of claim 4, wherein step (e) further includes introducing into the growth ambient a dopant of boron or nitrogen.

6. The method of claim 4, wherein, in step (e), the vanadium dopant is introduced into the growth ambient via controlled effusion.

7. The method of claim 4, wherein introducing the vanadium dopant into the growth ambient in step (e) includes moving the vanadium dopant from a position outside the growth crucible where the vanadium dopant is a solid to a position inside the growth crucible where the vanadium dopant produces vanadium vapors during sublimation growth of the SiC single crystal.

8. The method of claim 4, wherein a pressure inside of the growth crucible during sublimation growth of the SiC single crystal is between 1 and 100 Torr.

9. A crystal growth method comprising:
   (a) introducing a polycrystalline source material and a seed crystal into a growth ambient comprised of a growth crucible disposed inside of a furnace chamber;

(b) in the presence of a first sublimation growth pressure in the growth ambient, sublimation growing a single crystal on the seed crystal via precipitation of sublimated source material on the seed crystal in the presence of a flow of a first gas that includes a reactive component that reacts with gaseous nitrogen in the growth ambient forming a solid nitride compound, reacts with boron in the growth ambient forming a gaseous boron halide compound, or both; and (c) following step (b) and in the presence of a second sublimation growth pressure in the growth ambient, sublimation growing the single crystal on the seed crystal via precipitation of sublimated source material on the seed crystal in the presence of a flow of a second gas that includes dopant vapors, but which does not include the reactive component.

10. The method of claim 9, wherein:
each sublimation growth pressure is between 1 and 100 Torr; and
the first and second sublimation growth pressures can be the same or different.

11. The method of claim 9, further including introducing a source of the dopant vapors into the growth crucible between steps (b) and (c).

12. The method of claim 9, wherein steps (b) and (c) are performed without exposing the growth ambient to room ambient atmosphere between said steps.

13. The method of claim 9, wherein:
the reactive component of the first gas is a gaseous metal halide;
the dopant vapors of the second gas comprise gaseous vanadium; and
the second gas further comprises hydrogen, nitrogen or hydrogen+nitrogen.

14. A SiC crystal growth method comprising:
(a) providing a SiC single crystal seed and a polycrystalline SiC source material in spaced relation inside of a growth crucible that is disposed in a furnace chamber, wherein the crucible disposed in the furnace chamber defines a growth ambient;
(b) initiating sublimation growth of a SiC single crystal on the SiC single crystal seed in the growth ambient;
(c) following step (b), substantially removing background impurities of nitrogen and boron from the growth ambient during sublimation growth of the SiC single crystal on the SiC single crystal seed in the growth ambient; and
(d) following step (c), introducing vanadium and boron dopants into the growth ambient during sublimation growth of the SiC single crystal on the SiC single crystal seed in the growth ambient thereby sublimation growing a PI-type SiC single crystal on the SiC seed crystal, wherein the grown PI-type SiC single crystal is semi-insulating, has a room-temperature resistivity of at least $10^{10}$ Ohm-cm, and an activation energy of resistivity in the range between approximately 0.9 and 1.5 eV in the temperature range between room temperature and 400° C.

15. The SiC crystal growth method of claim 14, wherein the PI-type SiC single crystal further comprises:
shallow acceptors present in larger concentrations than shallow donors; and
vanadium present in concentrations sufficient to achieve full compensation.

16. The SiC crystal growth method of claim 14, wherein the PI-type SiC single crystal further comprises:
background nitrogen intentionally reduced in a concentration between $4\cdot10^{15}$ and $7\cdot10^{15}$ atoms-cm$^{-3}$; and
intentionally introduced boron and vanadium dopants in concentrations between $9\cdot10^{15}$ and $2\cdot10^{16}$ atoms-cm$^{-3}$, and $9\cdot10^{16}$ and $2\cdot10^{17}$ atoms-cm$^{-3}$, respectively.

17. The SiC crystal growth method of claim 14, wherein the PI-type SiC single crystal further comprises a 4H or 6H polytype.

18. A SiC crystal growth method comprising:
(a) providing a SiC single crystal seed and a polycrystalline SiC source material in spaced relation inside of a growth crucible that is disposed in a furnace chamber, wherein the crucible disposed in the furnace chamber defines a growth ambient;
(b) initiating sublimation growth of a SiC single crystal on the SiC single crystal seed in the growth ambient;
(c) following step (b), substantially removing background impurities of nitrogen and boron from the growth ambient during sublimation growth of the SiC single crystal on the SiC single crystal seed in the growth ambient; and
(d) following step (c), introducing vanadium and nitrogen dopants into the growth ambient during sublimation growth of the SiC single crystal on the SiC single crystal seed in the growth ambient thereby sublimation growing a NU-type SiC single crystal on the SiC seed crystal, wherein the grown NU-type SiC single crystal is semi-insulating, has a room-temperature resistivity of at least $10^{10}$ Ohm-cm, and an activation energy of resistivity between approximately 0.78 and 0.82 eV in the temperature range between room temperature and 400° C.

19. The SiC crystal growth method of claim 18, wherein the NU-type SiC single crystal further comprises:
shallow donors present in larger concentrations than shallow acceptors, and
vanadium present in concentrations sufficient to achieve full compensation.

20. The SiC crystal growth method of claim 18, wherein the NU-type SiC single crystal further comprises:
background boron intentionally reduced in a concentration between $2\cdot10^{15}$ and $8\cdot10^{15}$ atoms-cm$^{-3}$; and
intentionally introduced nitrogen and vanadium dopants in concentrations between $8\cdot10^{15}$ and $2\cdot10^{16}$ atoms-cm$^{-3}$, and $9\cdot10^{16}$ and $2\cdot10^{17}$ atoms-cm$^{-3}$, respectively.

21. The SiC crystal growth method of claim 18, wherein the NU-type SiC single crystal further comprises a 4H or 6H polytype.

* * * * *